United States Patent
Le Royer

(10) Patent No.: US 8,342,016 B2
(45) Date of Patent: Jan. 1, 2013

(54) METHOD FOR EVALUATING THE TRANSVERSAL GRIP OF A TIRE ON A SNOW COVERED GROUND

(75) Inventor: Fabrice Le Royer, Clermont-Ferrand (FR)

(73) Assignees: Michelin Recherche et Technique S.A., Granges-Paccot (CH); Compagnie Generale des Etablissements Michelin, Clermont-Ferrand (FR)

( * ) Notice: Subject to any disclaimer, the term of this patent is extended or adjusted under 35 U.S.C. 154(b) by 329 days.

(21) Appl. No.: 12/668,875

(22) PCT Filed: Jun. 5, 2008

(86) PCT No.: PCT/FR2008/000762
§ 371 (c)(1),
(2), (4) Date: Aug. 6, 2010

(87) PCT Pub. No.: WO2009/007523
PCT Pub. Date: Jan. 15, 2009

(65) Prior Publication Data
US 2010/0294031 A1    Nov. 25, 2010

(30) Foreign Application Priority Data
Jul. 12, 2007  (FR) .................................... 07 05070

(51) Int. Cl.
*G01M 17/02*    (2006.01)
(52) U.S. Cl. ............................................. 73/146; 701/1
(58) Field of Classification Search .......... None
See application file for complete search history.

(56) References Cited

U.S. PATENT DOCUMENTS

| | | | |
|---|---|---|---|
| 4,969,212 A | | 11/1990 | Walter |
| 5,388,046 A | * | 2/1995 | Anan et al. ....................... 701/91 |
| 6,155,110 A | * | 12/2000 | Lightner et al. ................. 73/146 |
| 6,353,777 B1 | * | 3/2002 | Harmison et al. ................. 701/1 |
| 6,580,980 B1 | * | 6/2003 | Gauthier et al. ............. 701/32.1 |
| 6,826,951 B1 | * | 12/2004 | Schuessler et al. ............. 73/146 |
| 7,142,961 B2 | * | 11/2006 | Gim et al. ..................... 701/32.9 |
| 7,263,419 B2 | * | 8/2007 | Wheals et al. .................. 701/36 |
| 2002/0134149 A1 | | 9/2002 | Shiraishi |
| 2005/0234628 A1 | | 10/2005 | Luders et al. |

FOREIGN PATENT DOCUMENTS

| | | |
|---|---|---|
| DE | 10 2004 051 654 | 4/2006 |
| EP | 1 201 521 | 5/2002 |
| EP | 1 380 972 | 1/2004 |
| EP | 1 460 409 | 9/2004 |

OTHER PUBLICATIONS

G. Phetteplace et al., "Measuring Lateral tire performance on winter surfaces", Tire Science & Technology, Tire Soc. Inc, vol. 35, No. 1, pp. 56-68, Mar. 2007.

* cited by examiner

*Primary Examiner* — Lisa Caputo
*Assistant Examiner* — Jermaine Jenkins
(74) *Attorney, Agent, or Firm* — Cozen O'Connor

(57) ABSTRACT

A method for evaluating the transversal grip of a type of tires on a snow-covered ground, of providing this type of tires to a vehicle, driving this vehicle at the transversal grip limit on a snow-covered track, and producing instantaneous measures of the vehicle transversal acceleration while it travels on the track. Track (P) includes a plurality of turns (V1, V2) making it possible to establish a transversal acceleration steady state, the transversal acceleration instantaneous measures being subjected to a low-pass filtering, and the transversal grip of a tire is judged as being even better the higher the transversal acceleration values obtained with this tire are.

18 Claims, 2 Drawing Sheets

METHOD FOR EVALUATING THE TRANSVERSAL GRIP OF A TIRE ON A SNOW COVERED GROUND

RELATED APPLICATIONS

This is a U.S. national stage under 35 USC §371 of application No. PCT/FR2008/000762, filed on Jun. 5, 2008.

This application claims the priority of French application No. 07/05070 filed Jul. 12, 2007, the content of which is hereby incorporated by reference.

FIELD OF THE INVENTION

The invention generally relates to the equipment and safety techniques for automobile vehicles.

More particularly, the invention relates to a method for at least relatively evaluating the transversal grip of a first-type tire on a snow covered ground, comprising at least the steps of providing tires of the first type to a wheeled vehicle, driving the thus equipped vehicle at the transversal grip limit on a snow-covered track comprising at least one turn, and producing instantaneous measures of the transversal acceleration of the vehicle during its travel on the track.

BACKGROUND OF THE INVENTION

The evaluation of the transversal grip—also called transversal potential—of a tire on the snow is still carried out mostly subjectively, by means of a behavior survey performed by a professional driver.

While merely satisfying, this situation may be easily explained by the difficulties that have to be solved in order to carry out such a survey objectively.

In fact, in the case of rigid grounds, the transversal potential of a tire is usually evaluated by a driving test on a ring-like lane, of a predefined diameter, during which test the time period taken by a vehicle to perform a lap at the transversal grip limit is picked up. Nevertheless, this technique, in which the vehicle follows the same trajectory at each passage, leads, in the case of snow-covered grounds, to large errors due to the rapid changes of the running surface caused by the repetitive passage of the tires on the same tracks.

SUMMARY OF THE INVENTION

One object of the invention is to provide a method for evaluating the transversal potential of a tire on a snow-covered ground of which repeatability is much higher than that of prior known methods.

This and other objects are attained in accordance with one aspect of the invention directed to a method, wherein the track includes at least two discriminating turns selected so as each one requires a travel time period by the vehicle of at least one second, this time period being measured between the end of a phase of growth of the vehicle transversal acceleration starting from a given acceleration threshold and the beginning of a return phase of returning to the vehicle transversal acceleration threshold, and wherein the method comprises at least a filtering step of producing transversal acceleration filtered measures by low-pass filtering the transversal acceleration instantaneous measures, and at least a selection step of identifying, from among the filtered measures, a set of at least one transversal acceleration per discriminating turn, the transversal grip of a tire is judged as being even better the higher the transversal acceleration values obtained for this tire are.

The expression "driving the vehicle at the transversal grip limit" used above should be understood in the sense known by a man skilled in the art and means "driving the vehicle while constantly remaining as close as possible to the transversal grip limit of the vehicle, but being lower than that limit".

The given transversal acceleration threshold may be advantageously equal to zero.

Preferably, the discriminating turns comprise at least a left turn and a right turn.

An embodiment of the method of the invention advantageously comprises at least a correction step of correcting the transversal acceleration filtered measures from any possible local or overall deviation between the values taken by these measures for the left and right turns, respectively.

In these conditions, the transversal acceleration measures may be performed while the vehicle covers the track a plurality of times.

Specifically, the track may be composed of a looped car track, which the vehicle covers at least once in the clockwise direction and at least once in the counterclockwise direction.

An embodiment of the method of the invention comprises a statistical analysis taking into account a plurality of maximal transversal acceleration values, recorded at each discriminating turn each time a respective coverage of this turn is made.

It is also judicious to provide the low-pass filtering such that it is made through a symmetric moving average, to provide the track such that it comprises at least four discriminating turns, and that each discriminating turn be selected such that the required time period for a vehicle to cover it be higher than two seconds, and preferably at least equal to three seconds.

In the case where the track has at least one non-discriminating turn, the selection step may comprise the operation of discarding the transversal acceleration measures carried out when the vehicle covers each non-discriminating turn.

DETAILED DESCRIPTION OF THE DRAWINGS

As previously stated, the invention relates to a method for evaluating the transversal grip of a tire on a snow-covered ground.

The evaluation sought is at least relative, that is, it should at least make it possible to compare and classify the transversal potentials of tires of two different types.

First, this method comprises an experimental phase of substantially providing a wheeled vehicle with tires to be evaluated, driving the thus equipped vehicle at the transversal grip limit on a non-straight, snow-covered track P (FIG. 1), and producing instantaneous measures of the transversal acceleration of the vehicle while it covers the track.

The equipment required for the implementation of this experimental phase comprises an accelerometer and an acquisition system, the acquisition system is for recording the output signal of the accelerometer at an appropriate frequency, for example, a frequency of 125 Hz.

In the case of a relative evaluation of the tire grip, plural types of tires are successively mounted on a same vehicle, with the accelerometer being disposed at any location on the vehicle as long as its position remains unchanged during the entire test period of the different tires.

According to the invention, the track used for the experimental phase includes at least two particular turns such as V1 to V4, which will be called "discriminating", and the number of which is preferably four.

In the sense of the invention, a discriminating turn is a turn of which coverage time period by the vehicle, as measured between the end of the transversal acceleration growing phase of this vehicle starting from zero and the beginning of a phase of returning to zero of this transversal acceleration, is at least equal to a second and preferably equal to three seconds.

Figure 1:
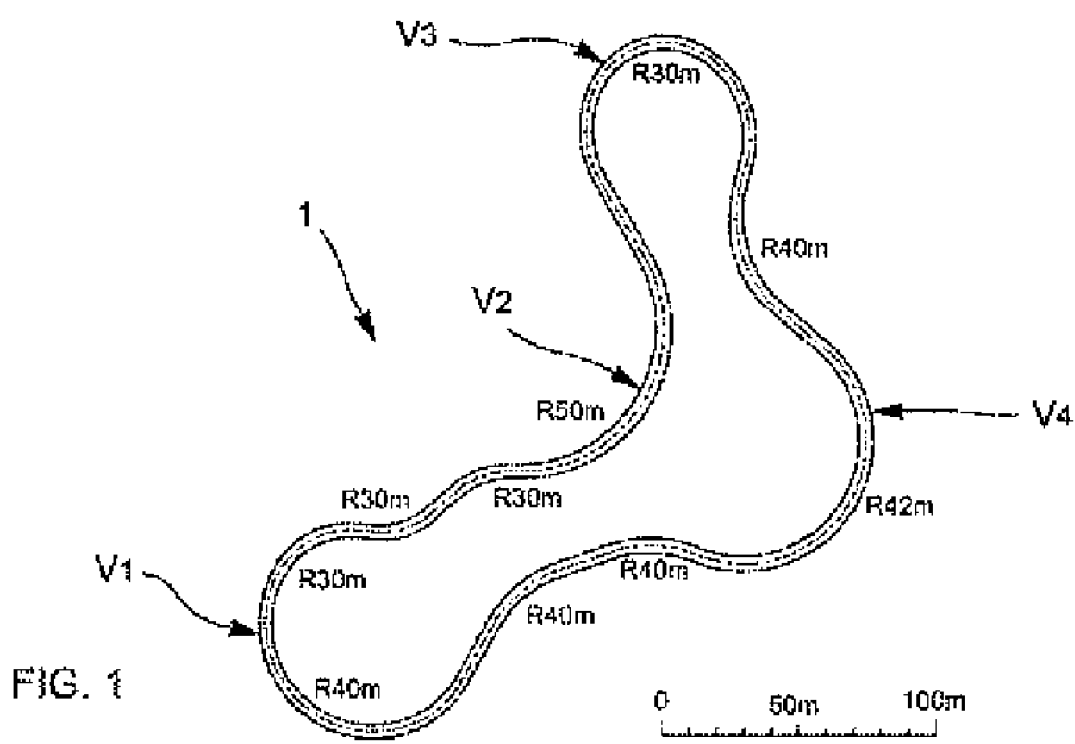
FIG. 1 is a top view of a track which can be used for the implementation of the method of the invention.

FIG. 1 illustrates the example, among many other possible examples, of a track which may be advantageously used for the implementation of the method of the invention.

This track, which is preferably substantially horizontal at least at the turns, is a looped car track which the vehicle may cover a plurality of times and particularly in the clockwise direction and in the counterclockwise direction, and which has a plurality of discriminating turns, among which left turns and right turns.

Figure 2:
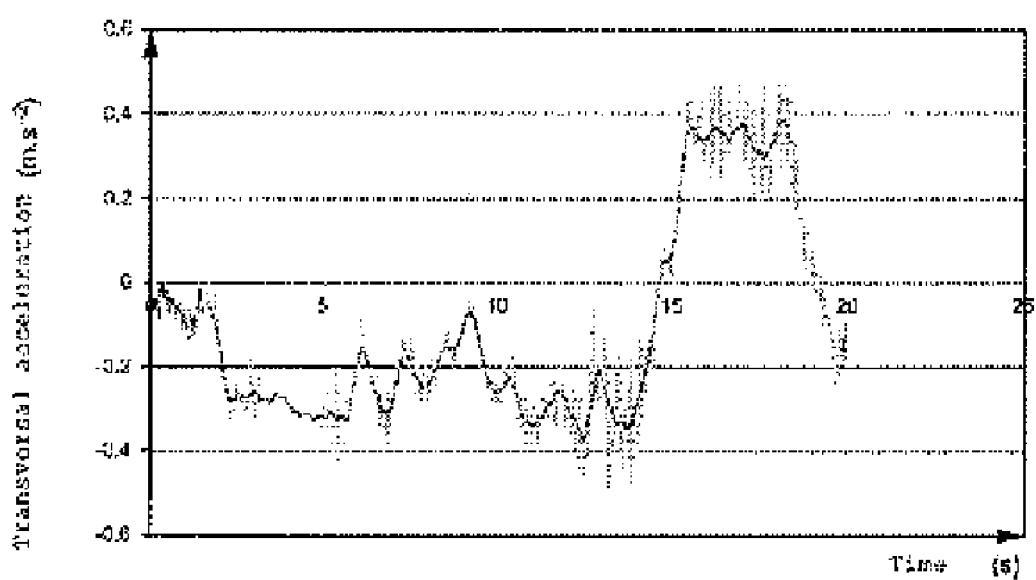
FIG. 2 is a diagram representing on the ordinate, as a function of time represented on the abscise and expressed in seconds, acceleration measures before filtering (dotted curve) and after filtering (solid line curve)

The dotted curve of FIG. 2 gives an example of transversal acceleration instantaneous measures, drawn for a vehicle provided with tires to be evaluated, and running at the grip limit, on such a snow-covered track.

Following the experimental phase which leads to the acquisition of these measures, the method of the invention comprises an analysis phase.

This analysis phase may advantageously begin with a pre-processing of correcting the raw transversal acceleration instantaneous measures so as to take into consideration the inclination taken by the turning vehicle du to the finite value of its roll stiffness.

The analysis phase further comprises a filtering step, of low-pass filtering the transversal acceleration instantaneous measures leading to transversal acceleration filtered measures, an example of which is given by the solid line curve of FIG. 2.

This low-pass filtering may notably be made by replacing each transversal acceleration instantaneous measure by a moving average, symmetric with regard to the timing of this instantaneous measure, of the instantaneous measures prior and subsequent to that timing.

In an exemplary embodiment, each transversal acceleration instantaneous measure may thus be replaced by a transversal acceleration filtered measure, considered at the same timing and constituted of an average, centered on this timing, of the 24 instantaneous measures picked up prior to that timing, and 24 instantaneous measures picked up after that timing, each transversal acceleration filtered measure taking thus into account the measures picked up during a 400 ms time span in the case of a sampling frequency equal to 125 Hz.

The analysis phase further comprises a selection step of identifying, from among the transversal acceleration filtered measures and for each discriminating turn, a set of one or more transversal acceleration measures relevant with regard to the transversal grip of the tested tire, this grip being judged as being even better the higher the transversal acceleration values obtainable for this tire are.

Many approaches may be considered for the implementation of this selection step.

For example, it is possible to choose, as an objective evaluation criterion of the transversal grip, the transversal acceleration average, on each discriminating turn, between a first peak corresponding to the end of the transversal acceleration growing phase and a last peak corresponding to the beginning of the return phase of the transversal acceleration to the given threshold $s1$.

It is also possible to seek, on each discriminating turn, the transversal acceleration average value in a steady state.

To this end, this average is for example calculated over a time window of at least a given duration T in which the transversal acceleration filtered values are comprised within a range of a magnitude lower than a given threshold $s2$.

By way of example, the duration T is at least equal to a second and the threshold $s2$ lower than 0.08 g.

It is also possible to use, as evaluation criterion, the set of transversal acceleration values determined according to the following steps:

determining, for each discriminating turn, all the filtered transversal acceleration peaks within the given turn;

calculating the transversal acceleration filtered values average for all the peaks of the discriminating turns of the car track;

discarding, from among all the previous transversal acceleration filtered values, the values whose absolute deviation relatively to the average is higher that a given threshold $s3$.

Threshold $s3$ may be of about 15%.

Figure 3:
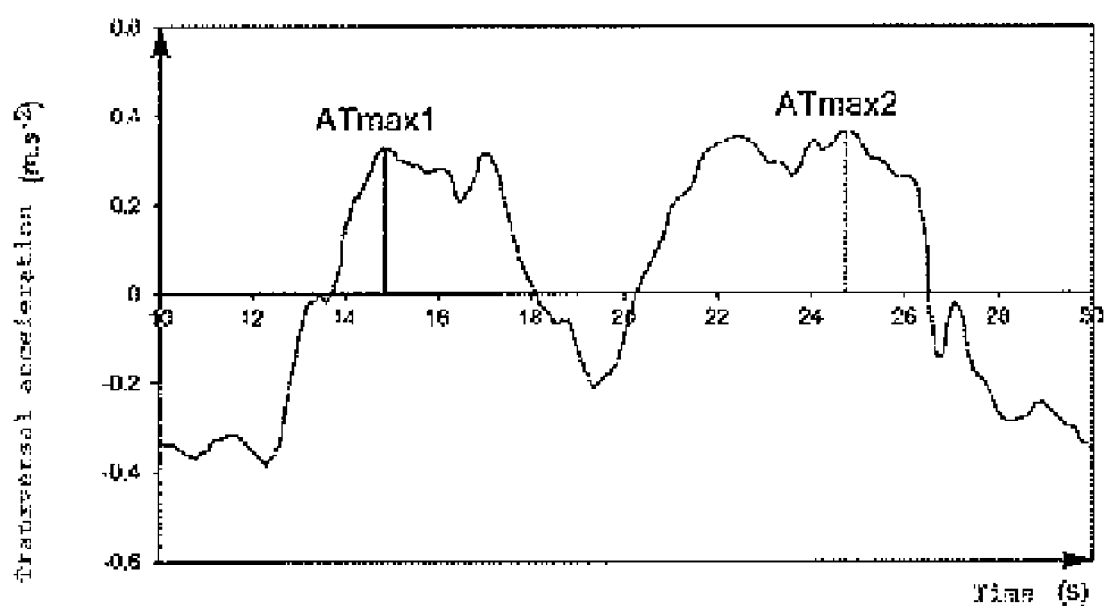
FIG. 3 is a diagram similar to that of FIG. 2, on which is illustrated, on a curve of filtered measures, the drawing of the maximal transversal acceleration values during the coverage of two successive discriminating turns.

Nevertheless, and because it is the most repetable, the preferred evaluation criterion of the transversal grip is constituted of the maximal value reached by the transversal acceleration in each discriminating turn, the choice of this criterion thus providing, during each coverage of a discriminating turn, a relevant value such as values $ATmax1$ an $ATmax2$ illustrated on FIG. 3.

Thus, when the track comprises one or more non-discriminating turns, the selection step preferably includes discarding the transversal acceleration measures performed when the vehicle covers each non-discriminating turn.

In order to correct the drifts of the accelerometer and/or the vehicle horizontal leveling errors, the method of the invention further comprises a correction step of correcting the transversal acceleration filtered measures from any possible local or overall deviation among the values taken by these measures for the left and right turns, respectively.

This processing, which is implemented after the filtering step and which lies on the hypothesis that the tire performances on a left turn are the same than those on a right turn, thus consists in offsetting the transversal acceleration values by half the deviation observed between the transversal acceleration values obtained on the right turns and on the left turns.

Finally, the method of the invention advantageously comprises a statistical analysis of all the maximal values obtained for the transversal acceleration, this statistical analysis being particularly relevant in the case where the vehicle covers the track a plurality of times, and where, correlatively, a plurality of transversal acceleration maximal values are available for each discriminating turn.

Such an analysis, which can be made by means of conventional statistical tools, make it particularly possible to objectively compare the transversal potential of tires of two different types while considering the tire with the best performance that tire which led to the highest transversal acceleration values provided that the deviations between these highest values and the values obtained with the other tire are only due to statistical variations.

The invention claimed is:

1. A method for evaluating the transversal grip of a tire of a first type on a snow-covered ground, comprising the steps of:
   providing tires of the first type to a wheeled vehicle;
   driving said wheeled vehicle thus equipped at the transversal grip limit on a snow-covered track comprising at least one turn;
   producing instantaneous measures of a transversal acceleration of the wheeled vehicle during its travel on the track, wherein said track includes at least two discriminating turns selected such that a time period required for the vehicle to cover each one of said discriminating turns is equal to at least one second, said time period being measured between the end of a phase of growth of the vehicle transversal acceleration starting from a given acceleration threshold and the beginning of a return phase of returning towards said vehicle transversal acceleration threshold;
   a filtering step of producing transversal acceleration filtered measures by low-pass filtering the transversal acceleration instantaneous measures; and
   a selection step of identifying, from among the filtered measures, a set of at least one transversal acceleration per discriminating turn, the transversal grip of said tire being rated according to a direct function of the transversal acceleration values obtained with said tire.

2. The evaluation method according to claim 1, wherein the given transversal acceleration threshold is equal to zero.

3. The evaluation method according to claim 1, wherein the discriminating turns comprise at least a left turn and a right turn.

4. The evaluation method according to claim 3, comprising a correction step of correcting the transversal acceleration filtered measures from any possible local or overall deviation between the values taken by these measures for the left and right turns, respectively.

5. The evaluation method according to claim 1, wherein the transversal acceleration measures are performed while the vehicle covers the track a plurality of times.

6. The evaluation method according to claim 5, wherein the track is a looped car track, which the vehicle covers at least once in a clockwise direction and at least once in a counter-clockwise direction.

7. The evaluation method according to claim 5, comprising a statistical analysis taking into consideration plural sets of transversal acceleration values, recorded in each discriminating turn during respective travels on this turn.

8. The evaluation method according to claim 1, wherein any the selection step comprises calculating, for each discriminating turn, the transversal acceleration filtered values average between a first peak corresponding to the end of the transversal acceleration growing phase and a last peak corresponding to the beginning of the phase of return towards the given transversal acceleration threshold.

9. The evaluation method according to claim 8, wherein the given threshold is lower than 0.08 g.

10. The evaluation method according to claim 1, wherein, for each discriminating turn, the selection step comprises:
    determining a time window of at least a given duration in which the transversal acceleration filtered values are comprised within a range of a magnitude lower that a given threshold; and
    calculating the filtered transversal accelerations average within this time window.

11. The evaluation method according to claim 10, wherein the time window duration is equal to at least 1 second.

12. The evaluation method according to claim 1, wherein the selection step comprises:
    determining, for each discriminating turn, all the filtered transversal acceleration peaks within the given turn;
    calculating the transversal acceleration filtered values average for all the peaks of the discriminating turns of the car track; and
    discarding, from among the set of the previous transversal acceleration filtered values, those values of which absolute deviation relative to the average is higher than a given threshold.

13. The evaluation method according to claim 12, wherein the given threshold is of about 15%.

14. The evaluation method according to claim 1, wherein the selection step comprises determining, in each discriminating turn, the maximal filtered transversal acceleration value.

15. The evaluation method according to claim 1, wherein the low-pass filtering is made through a symmetric moving average.

16. The evaluation method according to claim 1, wherein the track comprises at least four discriminating turns.

17. The evaluation method according to claim 1, wherein each discriminating turn is selected such that the time period required for the vehicle to cover it is higher than two seconds, and preferably at least equal to three seconds.

18. The evaluation method according to claim 1, wherein the track comprises at least one non-discriminating turn, and wherein the selection step comprises discarding the transversal acceleration measures performed while the vehicle covers each non-discriminating turn.

* * * * *